Figure 6:
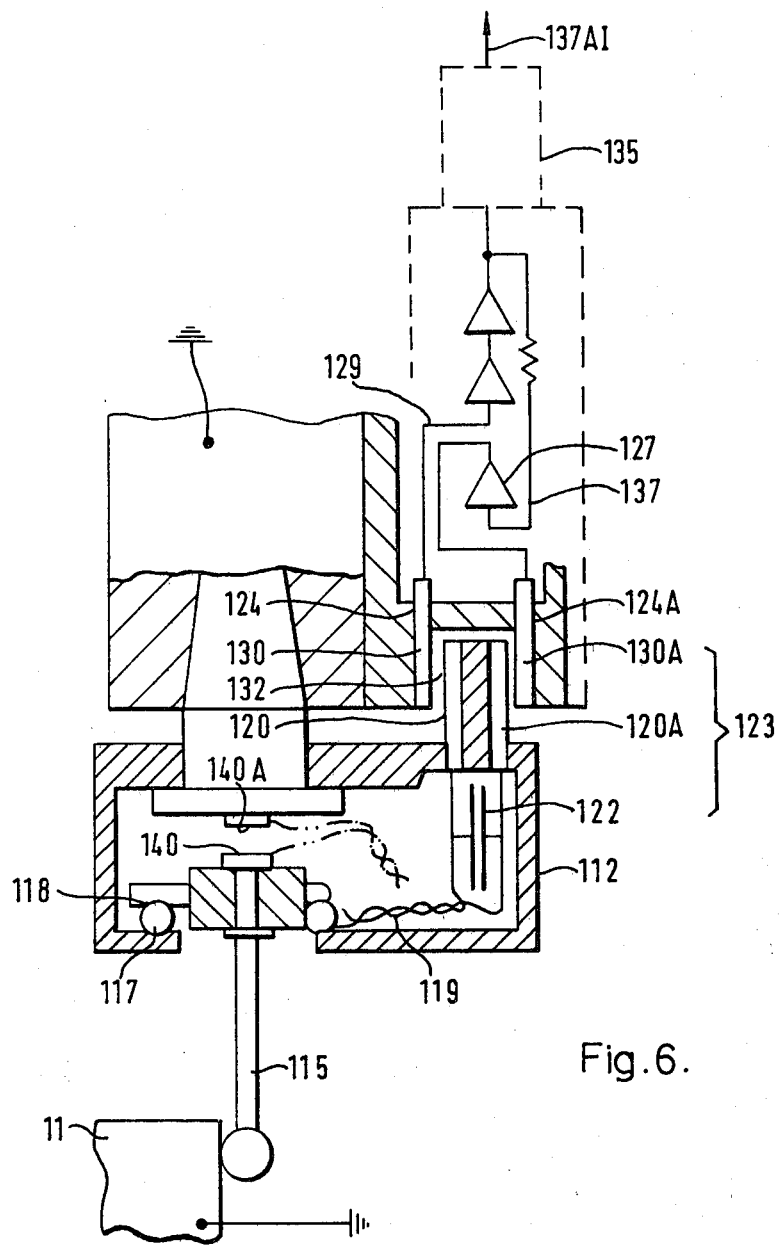

United States Patent [19]

Ellis

[11] 4,339,714

[45] Jul. 13, 1982

[54] PROBE HAVING PASSIVE MEANS TRANSMITTING AN OUTPUT SIGNAL BY REACTIVE COUPLING

[75] Inventor: Victor E. H. Ellis, Bristol, England

[73] Assignees: Rolls Royce Limited, London; Renishaw Electrical Limited, Gloucestershire, both of England

[21] Appl. No.: 51,389

[22] Filed: Jun. 25, 1979

[30] Foreign Application Priority Data

Jul. 7, 1978 [GB] United Kingdom ............... 29116/78

[51] Int. Cl.³ .................. G01B 7/14; G01R 33/00; G01B 7/02
[52] U.S. Cl. .................................. 324/207; 33/174 L; 324/262
[58] Field of Search ................................ 324/206–208, 324/234, 236, 237, 238, 262; 33/174 L

[56] References Cited

U.S. PATENT DOCUMENTS 2,747,152  5/1956  Greene ................................. 324/208
4,145,816  3/1979  Stobbe et al. .................... 324/174 L

FOREIGN PATENT DOCUMENTS 2023      5/1979  European Pat. Off. .
2403402   3/1975  Fed. Rep. of Germany .
1013928  12/1965  United Kingdom .
1133001  11/1968  United Kingdom .
1163169   9/1969  United Kingdom .
1210364  10/1970  United Kingdom .
1416692  12/1975  United Kingdom .
1528505  10/1978  United Kingdom .
1545271   5/1979  United Kingdom .

Primary Examiner—Gerard R. Strecker
Assistant Examiner—Walter E. Snow
Attorney, Agent, or Firm—Stevens, Davis, Miller & Mosher

[57] ABSTRACT

Apparatus for monitoring the state of a first circuit (19) by means of a second circuit (29) has an inductive coupling (23) linking the circuits across a gap (32). The second circuit embodies an oscillator (27) producing primary oscillations in that circuit and, through the coupling, secondary oscillations in the first circuit (19). If the state of the first circuit (19) is changed as by opening or closing of contacts (17,18), the resulting change in the impedance of the first circuit results in a change in the frequency of the primary and secondary oscillations. The second circuit (29) is connected to a detector (35) producing a signal (37AI) when the frequency changes. Instead of an inductive coupling, a capacitative coupling may be used.

The apparatus is described as applied to a machine for measuring length. The first circuit (19) is embodied in a probe (12) whereby the machine contacts a workpiece to be measured. The first circuit is opened by such contact. The second circuit (29) is embodied in a head on which the probe is releasably mounted. Since the first circuit (19) is a passive one, the probe does not need an independent power supply, and a power supply in the head serves any one such probe that may be mounted on the head.

6 Claims, 6 Drawing Figures

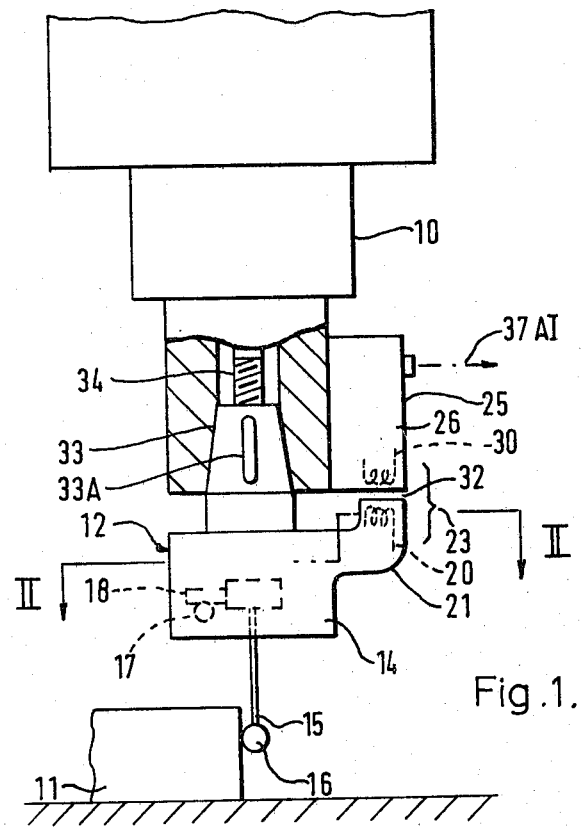
Fig.1.
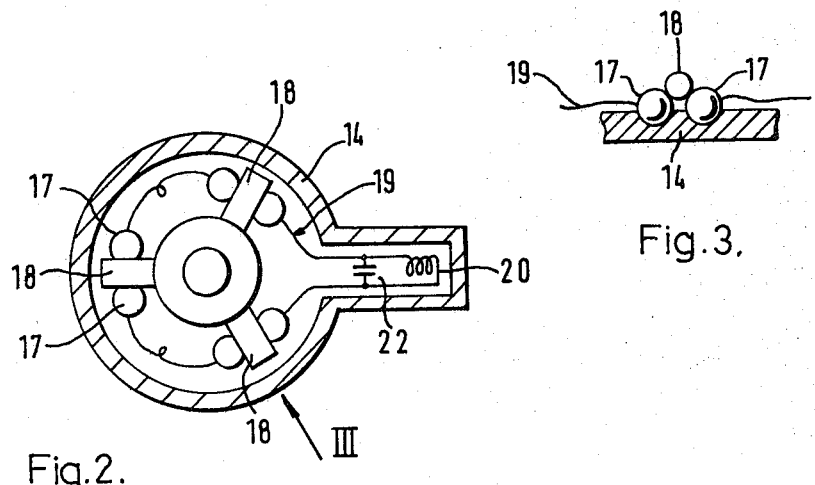
Fig.2.
Fig.3.

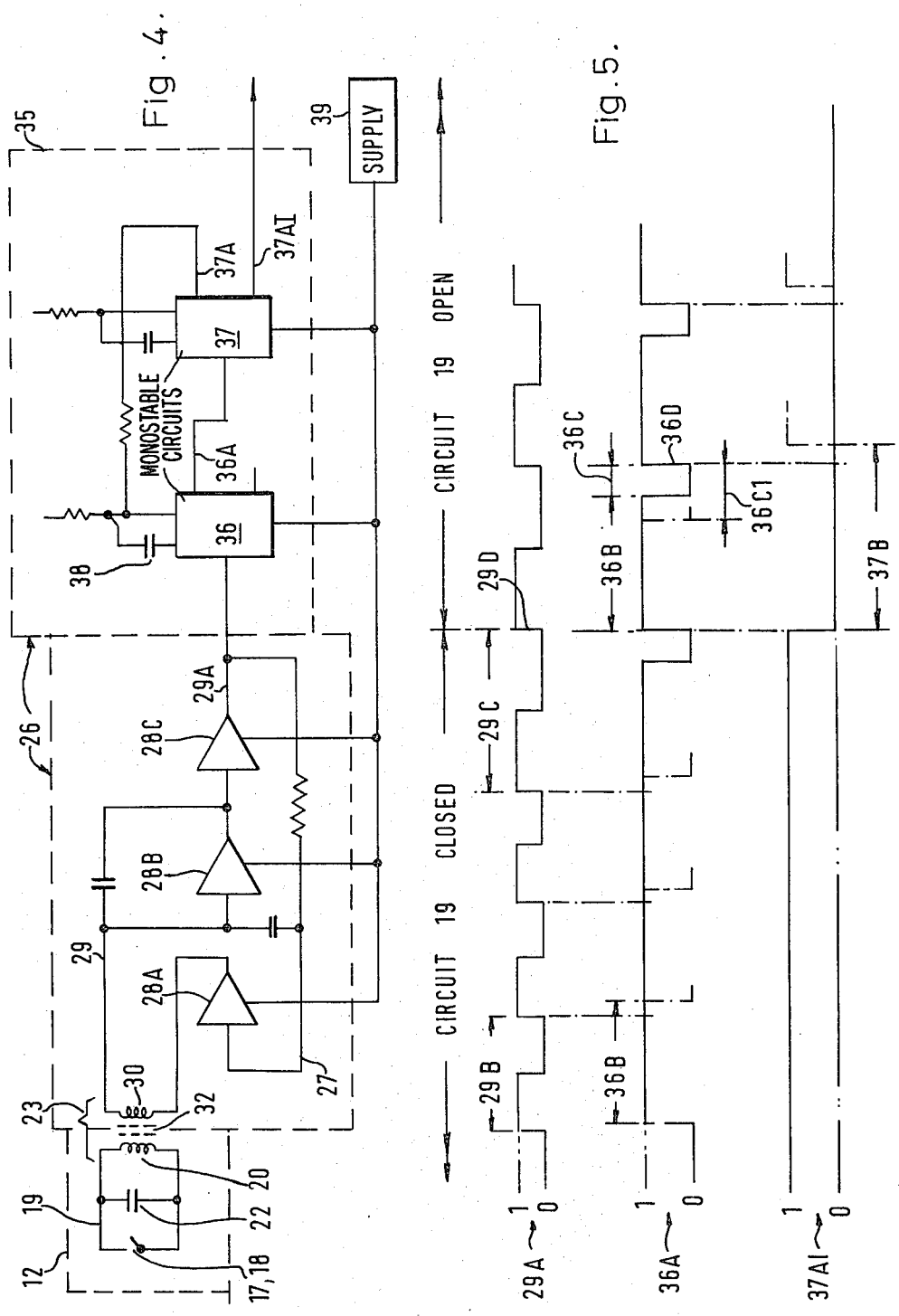

PROBE HAVING PASSIVE MEANS TRANSMITTING AN OUTPUT SIGNAL BY REACTIVE COUPLING

DESCRIPTION

This invention relates to apparatus for monitoring the state of an electrical circuit and to the use of such apparatus in length measuring machines.

It is known in a length measuring system to provide a probe releasably mounted on a head supported for movement relative to a workpiece. The probe comprises an electrical circuit adapted to change state and thereby provide an electrical signal when attaining, during said movement, a predetermined position relative to the workpiece. The signal, which is required for the purpose of measuring said predetermined position relative to a datum, has to be transmitted, in the first instance, to the head. In cases where the probe is mounted on and dismounted from the head by an automatic tool change mechanism, it has been found desirable not to rely on electrical contacts because of contamination of such contacts in a relatively dirty environment. It has, therefore, been proposed to transmit the signal across an insulator, e.g. an air gap, between the probe and the head by means of an inductive coupling. This has in the past involved providing a battery-powered oscillator circuit in the probe. However, it is often inconvenient to have to monitor the charge of the batteries and to replace the batteries when exhausted. It is an object of this invention to overcome this difficulty and generally to provide an improved apparatus for monitoring the state of a circuit across an insulator.

According to this invention there is provided apparatus for monitoring the state of a first electrical circuit by means of a second electrical circuit, comprising a reactive coupling having first and second components arranged at opposite sides of an insulator and connected to the first and the second circuit respectively, an oscillator connected to the second circuit to produce therein oscillations transmittable to the first circuit by virtue of said coupling, the first and second circuits co-operating to determine the impedance offered to said oscillations, means for changing the state of the first circuit thereby to change said impedance, and sensing means connected to the second circuit for sensing said change in said oscillations.

The invention enables the state of the first circuit to be read without the need for a power supply in the first circuit so that, in the above example of a length measuring system, there is no longer a need to provide a battery in the probe. The reactive coupling may be an inductive or a capacitative coupling.

An example of apparatus according to this invention will now be described with reference to the accompanying drawings wherein:

FIG. 1 is an elevation of the apparatus;
FIG. 2 is a section on the line II—II in FIG. 1;
FIG. 3 is a view on the line III in FIG. 2;
FIG. 4 is a circuit diagram;
FIG. 5 is a timing diagram; and
FIG. 6 is a circuit diagram showing a modification.

Referring to FIGS. 1 and 2, there is shown a part of a numerically controlled machine tool having a head 10 for supporting any one of a number of tools to be used for machining a workpiece 11. The tools are mounted in a magazine and are connected to and removed from the head by an automatic tool change mechanism not shown and well known per se. When machining is finished, or on any other appropriate occasion, the tool being connected to the head is a probe 12 for measuring the workpiece.

The probe comprises a stylus 15 having at one end 16 a ball-shaped tip for contacting the workpiece 11. At its other end the stylus 15 is provided with three radial arms 18 supported in a housing 14 of the probe on respective pairs of electrical contacts 17. The contacts 17 and an induction coil 20 are connected in series in a first circuit 19 being the circuit to be monitored. The coil 20 is the secondary coil of an inductive coupling 23. The contacts 17 support the stylus in a rest position in which each pair of the contacts 17 is bridged by the adjacent arm 18 and the circuit 19 is closed. When, as part of a measuring operation, the head 10 is moved to bring the stylus into contact with the workpiece, the stylus is displaced from the rest position by such contact and at least one of the arms is raised from at least one of the adjacent two contacts 17. This action opens the circuit 19 except for a capacitor 22 connected in parallel with the coil 20. The opening of the circuit 19 is an indication that the probe has a predetermined position relative to the workpiece.

The coil 20 is arranged in an extension 21 of the housing 14, the extension facing, in close proximity, a housing 25 provided on the head and containing a monitoring unit 26 whereby the state of the circuit 19, i.e. whether open or closed, is monitored. The extension 21 and the housing 25 are spaced apart by a small gap 32, say ⅛ inch wide, desirable to avoid engagement therebetween when the probe is secured to the head. The probe itself is secured to the head by a taper 33, a key 33A and a motor driven screw 34. The key 33A ensures alignment between the extension 21 and the housing 25.

The monitoring unit 26 comprises an oscillator 27, FIG. 4, essentially defined by an odd number, in this case three, of digital inverters 28A,28,28C connected in series in a second circuit 29 where the output of the last inverter 28C is connected to the input of the first inverter 28A. This causes current flow in the circuit 29 to oscillate in the form of a square wave 29A, FIG. 5. The parameters of this oscillation, i.e. the frequency, amplitude and phase of the wave, are determined by the impedance of the circuit 29. This impedance is determined in the first instance by certain circuit components including an induction coil 30 being the primary coil of the coupling 23.

The coils 20,30 are arranged to be in such proximity that there is mutual inductance between them. Thus the oscillations of the circuit 29 are transmitted to the circuit 19 by induction to generate secondary oscillations therein and the impedance offered to the primary oscillations 20A is determined by the inductive co-operation of the circuits 19,29 as modified by whether the circuit 19 is open or closed at the contacts 17. In other words, due to the mutual inductance between the two coils 20,30, the change in the resistance of the circuit 19 by opening or closing of this circuit is reflected by a change in the parameters of the primary oscillations.

The parameters concerned are the frequency, amplitude and phase of the wave 29A, FIG. 5. In the present example frequency, i.e. period length, is chosen as the parameter to be monitored. The coil 30 is connected in the circuit 29 in such a way that the wave 29A has a long period 29C, when the circuit 19 is open and a short period 29B when the circuit is closed.

The change in the frequency of the primary oscillations is detected by a detector 35 connected to the output of the last inverter 28C. The detector comprises two monostable circuits 36,37 connected in series. Each monostable circuit is set by the rising edge of an input thereto and its output remains at binary "1" (or binary "0" if inverted) for a predetermined time period. Each monostable circuit is resettable at any time during its predetermined time period to start a fresh predetermined time period. Therefore, if the reset signals occur before the end of any one predetermined time period, the monostable circuit is at "1" (or "0" if inverted) for so long as the reset signals are repeated.

The first monostable circuit 36 has an output 36A having a predetermined time period 36B which is greater than the short period 29B, but less than the long period 29C.

In consequence the first monostable circuit 36 remains at "1" continually when the circuit 19 is closed but is allowed to go to the end of its predetermined time period 36B when the circuit 19 is opened. However, in the latter case the monostable circuit 36 is reset by the next rising edge 29D of the primary oscillation 29A so that there occurs between the end of any one predetermined time period 36B and the next rising edge 29D a negative-going pulse 36C.

The output 36A of the first monostable circuit 36 is connected to the input of the second monostable circuit 37. The latter has inverted and non-inverted outputs 37AI,37A having a predetermined time period 37B which is greater than the period 29B of the primary oscillations when the circuit 19 is open. When the circuit 19 is closed, and the output of the first monostable circuit 36 is at "1" continually, there is no rising edge to reset the monostable circuit 37 whose output 37AI therefore remains continually at "1". When the circuit 19 is opened, and the output of the monostable circuit 36 manifests the rising edge 36D every time it is being reset by the rising edge 29D of the primary oscillation, the edge 36D keeps resetting the second monostable circuit 37 and the latter remains at "0" continually. The output 37AI of the second monostable circuit 37 is therefore a discrete indication of the state of the circuit 19, i.e. whether or not the stylus 15 has engaged the workpiece.

The response of the circuit 29 and detector 35 to the opening of the circuit should, as far as possible, be independent of the speed at which the head moves the probe toward the workpiece. To this purpose a relatively high frequency say 500 KHz, i.e. a period 29C of 2 $\mu$s, is desirable for the primary oscillations when the circuit 19 is open. A typical change due to the circuit 19 closing is of the order of 10% resulting in a frequency of 450 KHz or a period 29B of 1.8 $\mu$s.

During the opening of the circuit 19 the change from the short periods 29B to the long periods 29C occurs at a finite rate. Accordingly, the width of the pulse 36B develops from zero to its maximum over a period of time which can be unduly long in the context of a requirement for a high response to engagement between the stylus and the workpiece. In order to ensure a rapid and positive response to the pulse 36B, even when the latter is only just beginning to form, the non-inverted output 37A of the second monostable 37 is connected to timing components 38 of the first monostable 36 in the sense of reducing the predetermined time period thereof. This has the effect of increasing the width of the pulse 36C in the sense shown at 36C1. The effect is that a well-defined rising edge 36D is produced at an early stage to reset the second monostable circuit 37.

As mentioned, the change from the short to the long periods 29B,29C takes place at a finite rate. This is in part due to the fact that when the contacts 17,18 open, the resistance between rises at a finite rate. This is in part due to the fact that when the contacts 17,18 open, the resistance between them rises at a finite rate while the pressure between the contacts is relieved, and rises to infinity on actual separation of the contacts. The capacitor 22 is a matter of detail and is generally not essential.

The monitoring unit 26 is powered by a DC supply 39 ultimately derived from a mains supply. Thus there is no question of having to provide a battery, i.e. an independent supply in the probe itself and by virtue of the coupling 23 the probe can be mounted on or dismounted from the head without involving the use of electrical contacts.

Referring to FIG. 6 there is shown a first electrical circuit 119 arranged in a probe 112, similar to the probe 12 of FIG. 1, and having a switch contact 117,118. A capacitative coupling 123 comprises a first capacitor 124 having plates 120,130 confronting one another across a gap 132, the coupling further comprising a second capacitor 124A having plates 120A,130A similarly confronting one another across the gap 132. The circuit 119 is connected between the plates 120,120A and may include a further capacitor 122 connected across the contacts 117,118. A second circuit 129 corresponding to the circuit 29 of FIG. 4 is connected to the plates 130,130A and includes an oscillator 127. The impedance offered to the oscillations in the circuit 129 is determined by the capacitative co-operation of the circuits 119,129 as modified by whether the circuit 119 is open or closed. The change in the resistance of the circuit 119 due to opening or closing of this circuit is reflected by a change of the parameters of the oscillations. This change is detected by a detector 135 corresponding to the detector 35 of FIG. 4 and having an output 137AI.

FIG. 6 also shows a modification wherein, instead of being normally closed by the contacts 117,118, the circuit 119 is normally open and is closed by electrical contact with the workpiece 11. To this end the stylus, denoted 115, of the probe 112 is electrically connected to one of the capacitors 124 as shown at 140 while the other capacitor 124A is electrically connected to earth, i.e. to the head 10, as shown at 140A. The workpiece 11 is conductive and is also connected to earth. Therefore, when the stylus 115 makes contact with the workpiece, the circuit 119 is closed and vice versa. In other words, the signal 137AI changes when the position of the probe is such that the stylus 115 makes or breaks contact with the workpiece. It is clear that, in this example, the probe incudes only a part of the circuit 119, the remainder being formed by the earth common to the workpiece 11 and the head 10. Further in this example, the arms 118 and spherical contacts 117 only serve to provide mechanical support for the stylus 115 and have no electrical significance. It is of course immaterial in this example whether the coupling 123 is a capacitative or an inductive one.

In all the examples described the state of the first circuit 19 or 119 is changed by completely opening or closing this circuit, i.e. by changing its resistance effectively between zero and infinity. Such a powerful change of state in what is effectively a passive circuit is advantageous in producing in the second circuit 29 or 129 a reaction sufficiently powerful to facilitate the reading of the state of the circuit 19 or 129.

I claim:

1. A machine tool comprising: a head, a probe detachably secured to said head, said head being movable relative to a workpiece to bring said probe into a predetermined position relative thereto for the purpose of taking a measurement of said workpiece, a first electric circuit provided on said probe, said first electric circuit having no source of operative power, a second electric circuit provided on said head, a reactive coupling having adjacent electric coupling parts which are not wired together and which are respectively provided on opposing portions of said head and said probe and spaced apart by an air gap separating said opposing portions, said electrical coupling parts being respectively arranged in said first and second electric circuits, the coupling part arranged in the first circuit being separable from the coupling part arranged in the second circuit upon detachment of said probe from said head, an oscillator connected to the second circuit to produce therein oscillations transmittable to the first circuit by virtue of said coupling when the probe is secured to the head, the first and second circuits cooperating to determine the impedance offered to said oscillations in said second circuit, means provided on the probe for stepwise changing the state of the first circuit responsive to the probe attaining said predetermined position to thereby stepwise change said impedance, and sensing means connected to the second circuit for sensing changes in the oscillations in said second circuit produced by a change in said impedance.

2. A machine tool according to claim 1 wherein the means for changing the state of the first circuit comprise a means for varying the resistance of the first circuit.

3. A machine tool according to claim 1 wherein the means for changing the state of the first circuit comprise a means for opening and closing the first circuit.

4. A machine tool according to claim 1, wherein said sensing means comprises means for sensing a change in the length of the period of said oscillations.

5. A machine tool according to claim 4, wherein said sensing means comprises a monostable circuit connected to the second circuit which is reset by successive oscillations in said second circuit, the monostable circuit having a predetermined time period greater than the length of shorter ones of said oscillation periods thereby producing a series of pulses when said periods are long, and means for producing a continuous output responsive to the occurrence of a said pulse.

6. A machine tool according to claim 5 comprising means for reducing the predetermined time period of said monostable circuit responsive to the occurrence of said output.

* * * * *